United States Patent [19]
Yamashita et al.

[11] Patent Number: 4,749,459
[45] Date of Patent: Jun. 7, 1988

[54] METHOD FOR MANUFACTURING A THIN FILM MAGNETIC RECORDING MEDIUM

[75] Inventors: Tsutomu T. Yamashita; Ching-Cheng Shir, both of San Jose; Tu Chen, Saratoga, all of Calif.

[73] Assignee: Komag, Inc., Milpitas, Calif.

[21] Appl. No.: 838,220

[22] Filed: Mar. 10, 1986

[51] Int. Cl.$^4$ .............................................. C23C 14/34
[52] U.S. Cl. .............................. 204/192.15; 204/192.2
[58] Field of Search ................ 204/192.15, 192.2, 298; 428/900

[56] References Cited

U.S. PATENT DOCUMENTS

| | | | |
|---|---|---|---|
| 3,961,946 | 6/1976 | Makino et al. | 75/172 R |
| 4,438,066 | 3/1984 | Aboaf et al. | 420/435 |

FOREIGN PATENT DOCUMENTS

| | | | |
|---|---|---|---|
| 61106 | 4/1984 | Japan | . |
| 0078518 | 5/1984 | Japan | 204/192.2 |

OTHER PUBLICATIONS

Opfer et al., "Thin-Film Memory Disc Development", published in Hewlett-Packard Journal, Nov. 1985, pp. 4-10.
Treves et al., "Platinum-Cobalt Films for Digital Magneto-Optic Recording", published in Journal of Applied Physics, vol. 46, No. 6, Jun., 1975, pp. 2760-2765.
Treves et al., "PtCoCr Films for Digital Magneto-Optic Recording", published in IBM Technical Disclosure Bulletin, vol. 17, No. 12, May, 1975, pp. 3714-3715.
Allyn et al., "Thin-Film Discs: Magnetic, Electrical and Mechanical Design", published in Hewlett-Packard Journal, Nov. 1985, pp. 36-40.
O'Hanlon, John F., "A User's Guide to Vacuum Technology", published in 1980 by John Wiley & Sons, pp. 130-137.
Yanagisawa et al., "Corrosion-Resisting Co-Pt Thin Film Medium for High Density Recording", IEEE Transactions on Magnetics, vol. MAG-19, No. 5, Sep., 1983, pp. 1638-1640.
Maeda, H., "High Coercivity Co and Co-Ni Alloy Films", published in Journal of Applied Physics, May, 1982, vol. 53, No. 5, pp. 3735-3739.
Maeda, H., "Effect of Nitrogen on the High Coercivity and Microstructures of Co-Ni Alloy Films", published in Journal of Applied Physics, Oct., 1982, vol. 53, No. 10, pp. 6941-6945.
Howard, J. K., "Thin Films for Magnetic Recording Technology: A Review", published in Journal of Vacuum Science & Tech., Jan., 1986, pp. 1-13.
Tu Chen et al., "The Effect of Orientation, Grain Size and Polymorphism on Magnetic Properties of Sputtered Co-Re Thin Film Media", IEEE Transactions on Magnetics, vol. MAG-17, No. 6, Nov., 1981, pp. 3187-3189.
H. Potzlberger, "Magnetron . . . Heads", IEEE Trans. on Mag., vol. Mag-20, No. 5, 9/84, pp. 851-853.
T. Serikawa, "Permalloy . . . Sputtering", Review of The Elect. Com. Lab., vol. 25, Nos. 3-4, 3/77-4/77, pp. 209-216.

Primary Examiner—John F. Niebling
Assistant Examiner—Nam X. Nguyen
Attorney, Agent, or Firm—Kenneth E. Leeds; Alan H. MacPherson; Paul J. Winters

[57] ABSTRACT

A film of magnetic recording media is formed by sputtering an alloy of cobalt and platinum onto a substrate. The sputtering takes place in a chamber containing argon and nitrogen. The magnetic coercivity of the resulting film is controlled by varying the concentration of nitrogen in the sputtering chamber. By using this technique, the film coercivity is controlled without varying other important parameters such as the saturation magnetization.

17 Claims, 6 Drawing Sheets

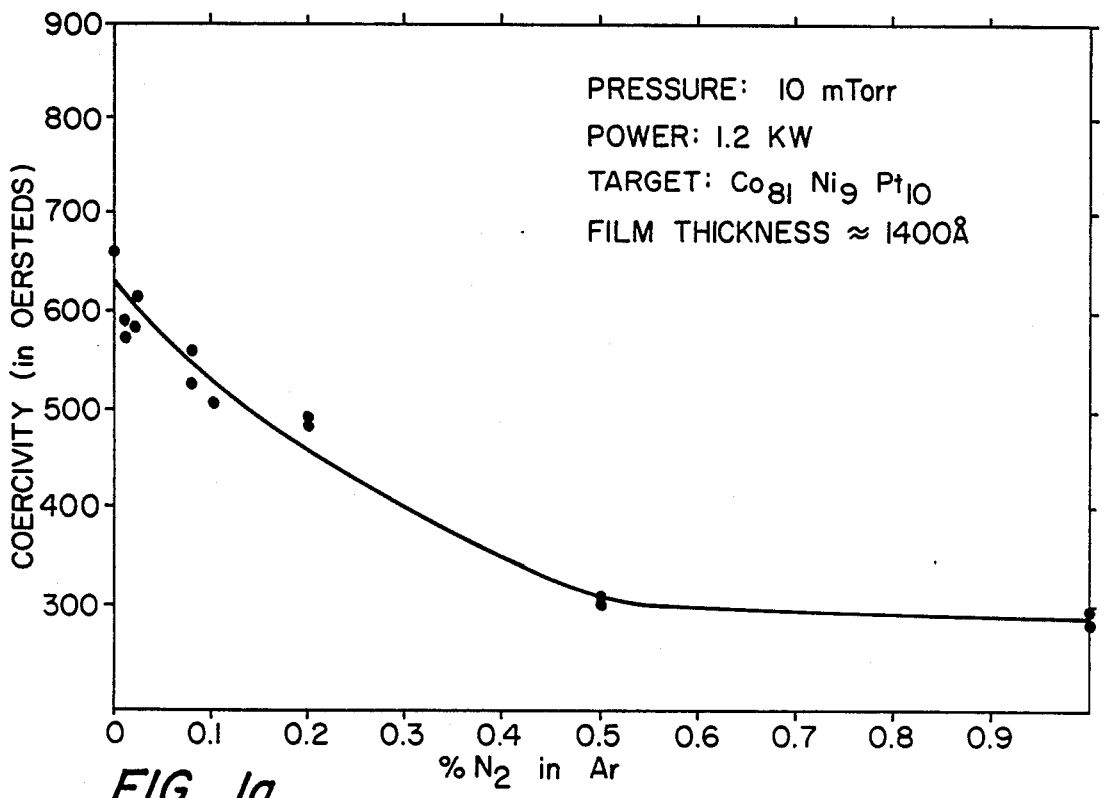
FIG._1a.
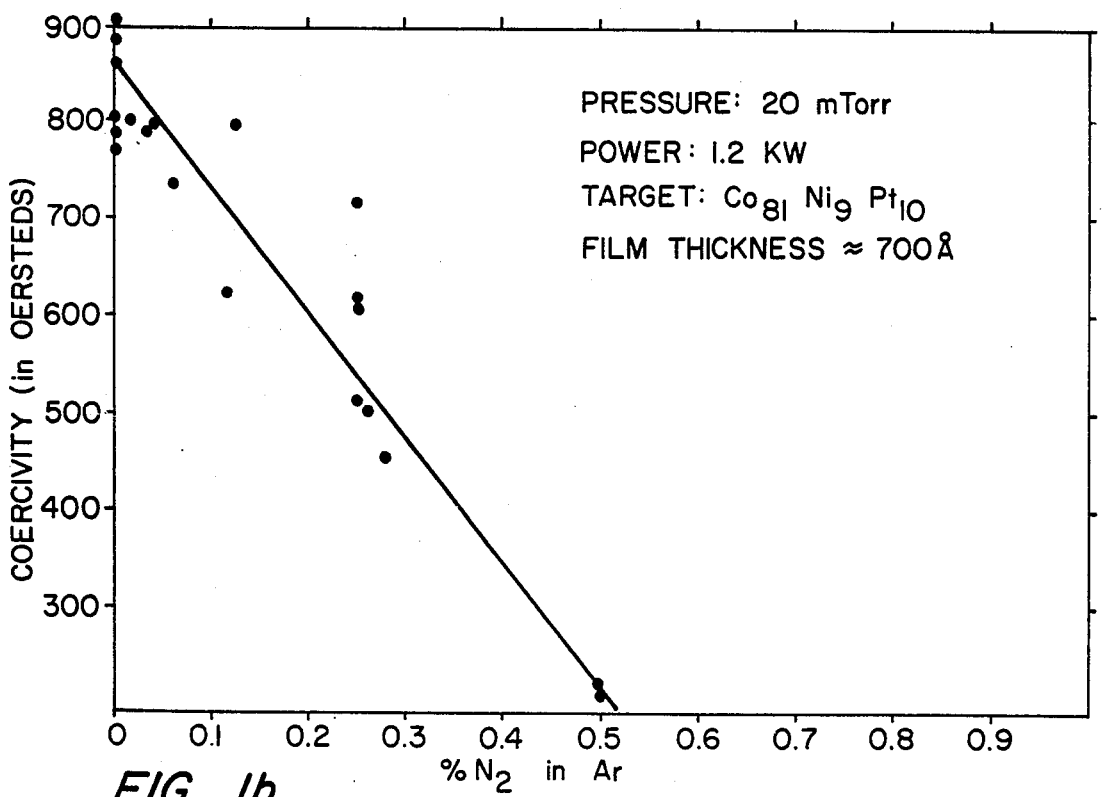
FIG._1b.

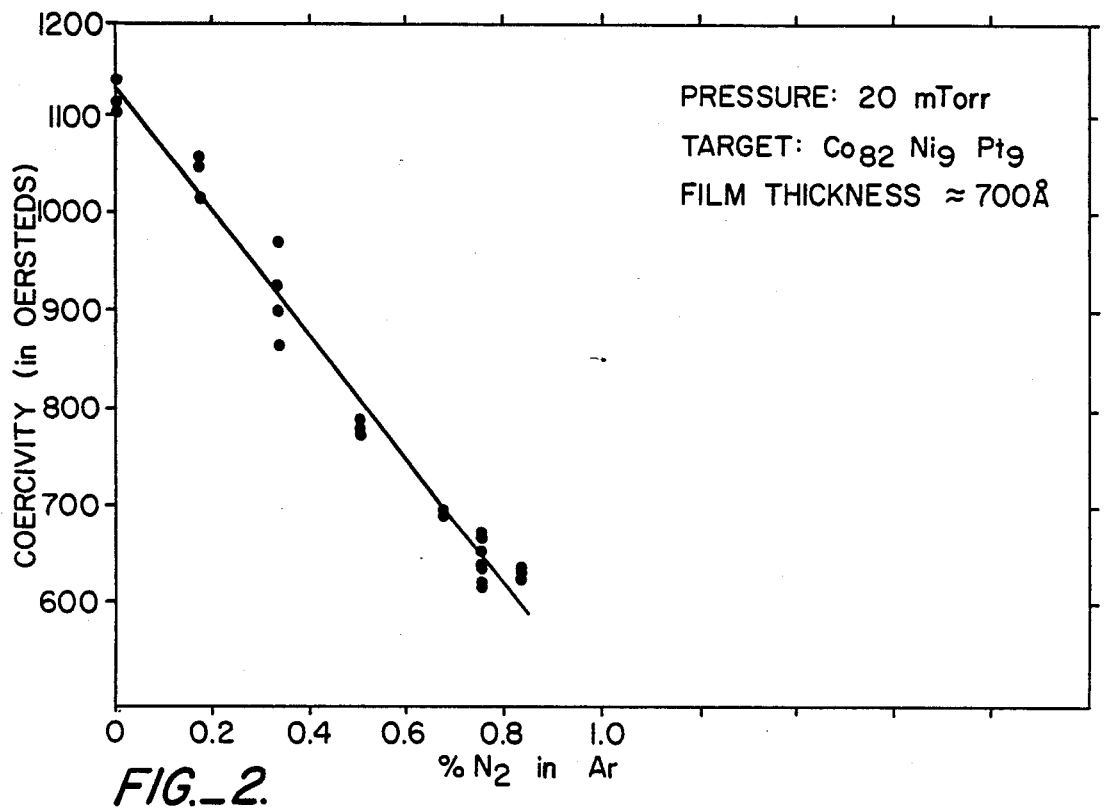
FIG._2.
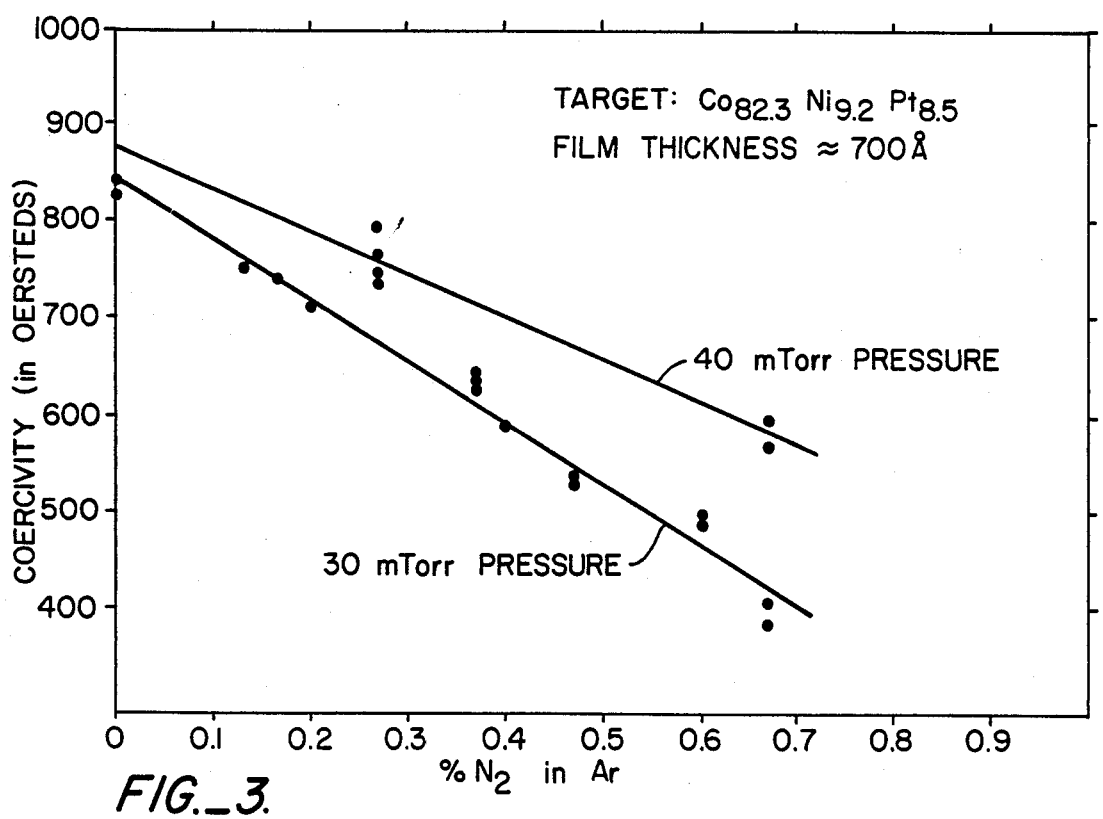
FIG._3.

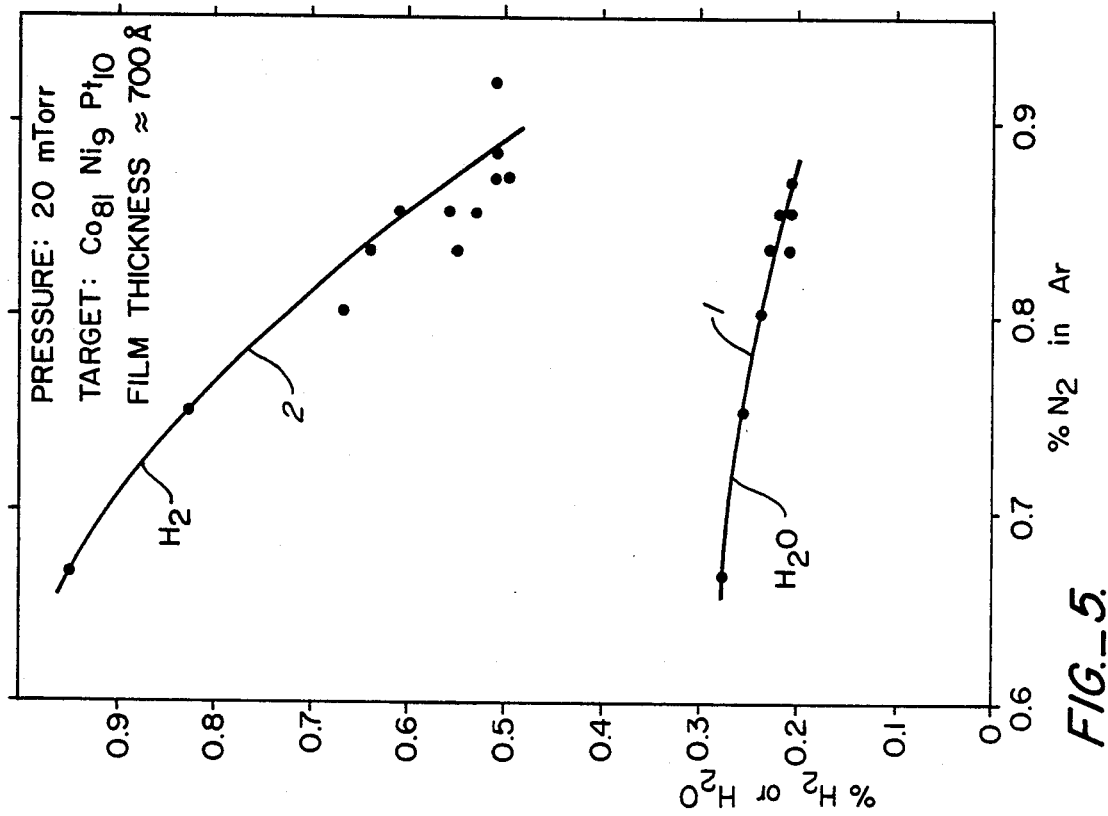
FIG._5.
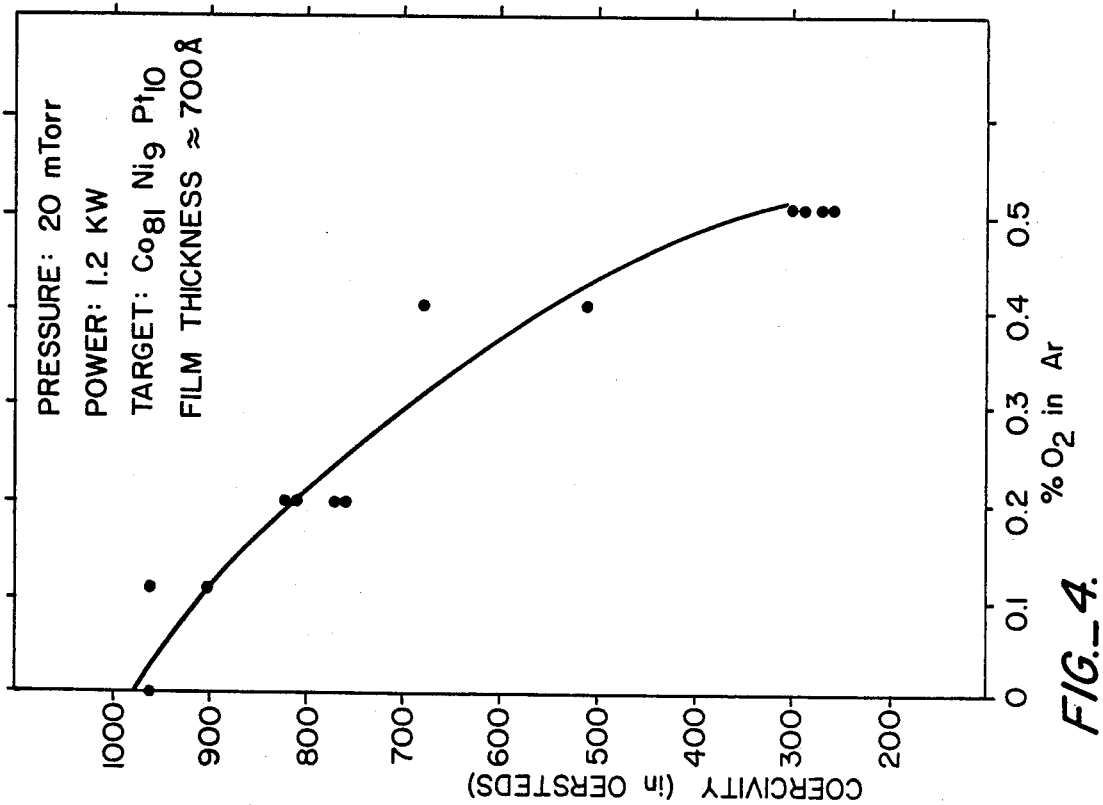
FIG._4.

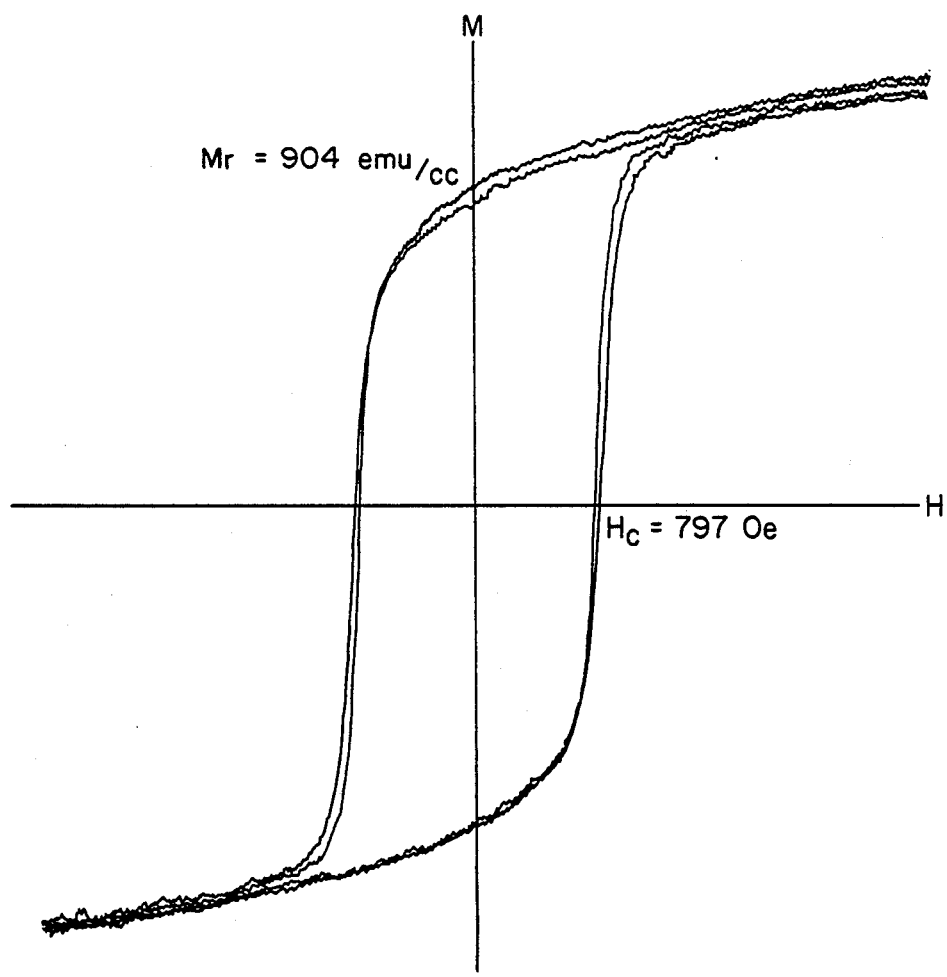
FIG._6a.

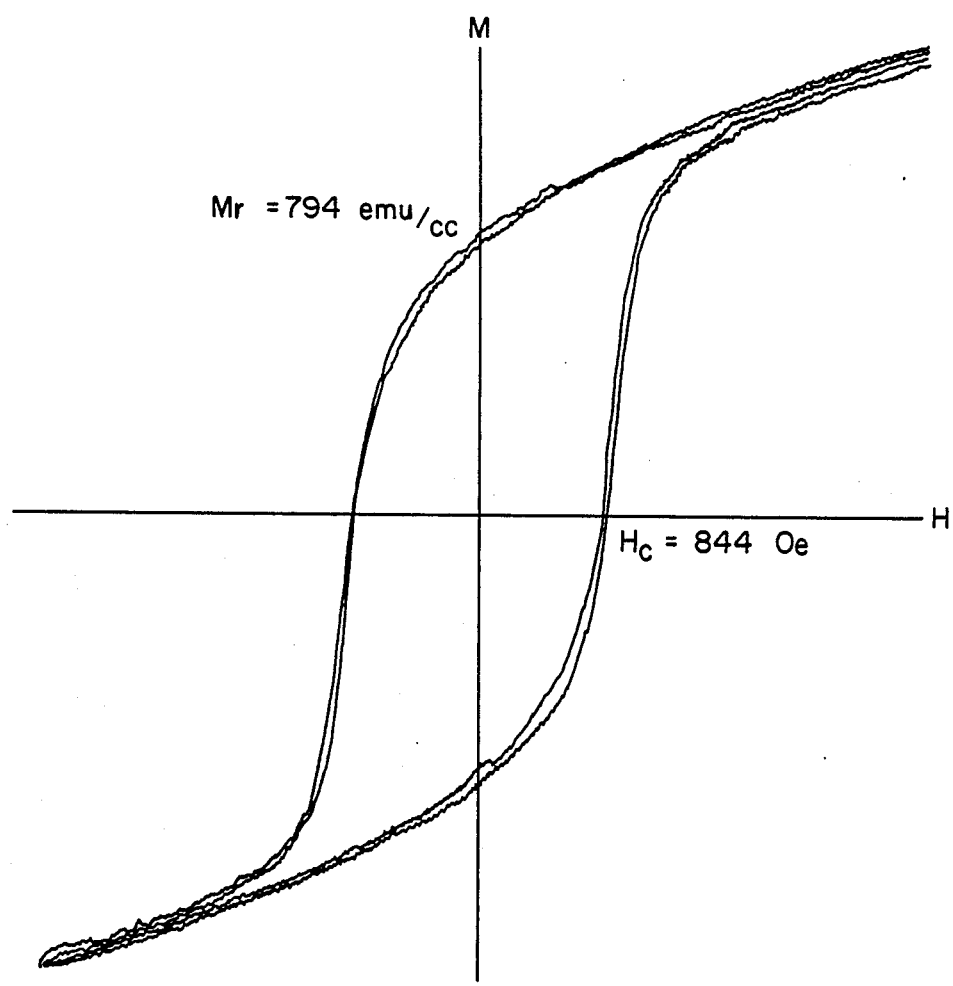
FIG._6b.

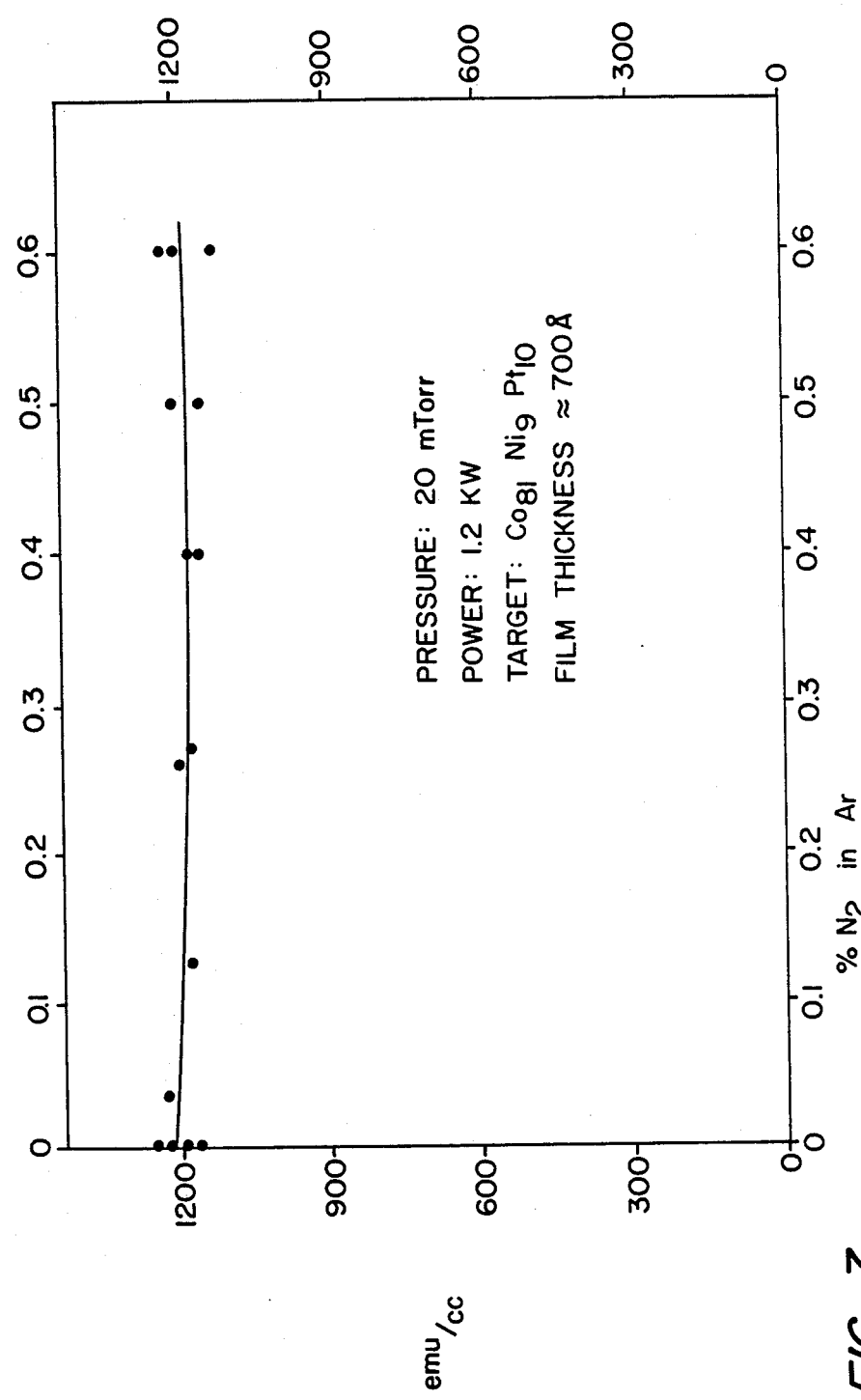
FIG._7.

METHOD FOR MANUFACTURING A THIN FILM MAGNETIC RECORDING MEDIUM

BACKGROUND OF THE INVENTION

1. Field of the Invention

This invention relates to thin film magnetic recording media and methods for forming thin film magnetic recording media.

2. Description of the Prior Art

It is known in the art that metallic thin films permit a higher recording density than conventional iron oxide particles suspended in a binder. In order to achieve a high recording density, it is necessary to minimize the film thickness, e.g., below 1000Å. In addition, the coercivity Hc must be high enough to sustain a high density of flux reversals per inch. For example, to sustain a packing density of 10,000 to 50,000 flux reversals per inch, the coercivity is preferably between 600 and 2000 Oersteds (Oe). If the coercivity is greater than 2000 Oe, it is difficult to both read and write data onto the film using conventional single element read/write heads.

In order to provide a good output signal from the media, it is necessary to have a high saturation magnetization Ms, e.g. greater than 400 emu/cc and preferably greater than 800 emu/cc. It is also necessary to have a high magnetic remanent Mr and a hysteresis squareness S of at least 80%. (S=Mr/Ms.) The strength of the magnetic field received by the disk read head is proportional to the film thickness T times the magnetic remanent Mr. Mr. T should generally be greater than approximately $2 \times 10^{-3}$ emu/cm$^2$ in order to achieve strong enough output signal from the film.

The above-mentioned parameters are described in greater detail in "Thin Films for Magnetic Recording Technology: A Review" by J. K. Howard, published in the Journal of Vacuum Science and Technology in 1985, and incorporated herein by reference.

Typical films used in magnetic recording media include cobalt alloys such as Co-Ni, Co-Pt, and Co-Ni-Pt. A number of processes have been suggested for controlling the coercivity Hc, saturation magnetization Ms, and magnetic remanent Mr of such films. For example, a paper entitled "Thin-Film Memory Disc Development" by Opfer et al., published in the Hewlett-Packard Journal in 1985, incorporated herein by reference, suggests that the coercivity of a film can be controlled by forming a Co-Pt film on a chromium underlayer. The coercivity of the film is dependent on the thickness of the chromium underlayer. Unfortunately, manufacturing processes including the step of forming a chromium underlayer are relatively complicated and expensive.

Opfer also indicates that coercivity can be controlled by varying the platinum concentration in the film. However, this means that if it is desired to use the same sputtering equipment to form films of different coercivities, it is necessary to change the sputtering target, which is generally inconvenient to do.

Japanese patent application No. 171694/82, filed by Masahiro Yanagisawa on Sept. 30, 1982, incorporated herein by reference, suggests that coercivity of a Co-Pt-Ni film can be controlled by varying the amount of nickel in the film. Unfortunately, this technique also requires changing the sputtering target if it is desired to change the film coercivity.

"Effect of Nitrogen on the High Coercivity and Microstructures of Co-Ni Alloy Films" by H. Maeda, published in the Journal of Applied Physics in 1982, incorporated herein by reference, discusses controlling the coercivity of a Co-Ni film by sputtering the film in an atmosphere including argon and nitrogen. Maeda increases the coercivity of the film by increasing the nitrogen gas concentration in the sputtering chamber, e.g., to a concentration of about 24% by volume. Unfortunately, this causes the film saturation magnetization Ms to decrease.

SUMMARY

In accordance with our invention, a magnetic medium is provided having a coercivity which is controlled without affecting other parameters, such as saturation magnetization, and without having to change the sputtering target. To make one embodiment of the media of our invention, a thin film recording medium is sputtered onto a suitable substrate in an environment containing trace amounts of a selected gas. The medium is typically an alloy including cobalt and platinum. The coercivity of the medium is controlled by varying the trace amounts of the selected gas in the sputtering chamber during sputtering. The higher the trace amounts, the lower the coercivity and vice versa.

In one embodiment, a gaseous mixture comprising argon and trace amounts of nitrogen is introduced into the sputtering chamber, and the coercivity of the film is controlled by controlling the concentration of nitrogen in the gaseous mixture. The gaseous mixture is typically less than 1% nitrogen, and the coercivity of the resulting film decreases as the concentration of nitrogen increases.

Unlike the Maeda process discussed above, we form a magnetic film using an alloy having an intrinsically high coercivity, such as a Co-Pt base alloy. (As used herein, intrinsic coercivity is the coercivity a film would have if it did not contain nitrogen.) We place only trace amounts of nitrogen in the sputtering chamber to dope the alloy in order to control coercivity. In contrast, Maeda sputters an alloy film onto a substrate in the presence of a large concentration of nitrogen, thereby introducing a large quantitity of nitrogen into the film to change the microstructure of the film and hence increase the film coercivity.

In our process, film coercivity is decreased (rather than increased) by sputtering in the presence of nitrogen. These results are achieved without altering the film saturation magnetization. Of importance, because the coercivity of the film is controlled without having to vary saturation magnetization, the film has uniform high coercivity squareness across the film surface and a high saturation magnetization. In addition, the film exhibits a high magnetic hysteresis loop squareness and hence a high magnetic remanent and therefore a high signal to noise ratio can be obtained from the film. In contrast, because Maeda uses a high nitrogen concentration in the sputtering chamber, he decreases saturation magnetization to a value less than the saturation magnetization we obtain. Finally, it should be noted that it is not necessary to anneal a film formed in accordance with our invention after sputtering. In contrast, it is necessary to anneal a film formed using Maeda's process to increase saturation magnetization.

In accordance with another embodiment of our invention, instead of sputtering in the presence of nitrogen (N$_2$), a gas such as ammonia (NH$_3$) which decomposes into nitrogen is introduced into the sputtering chamber during sputtering. Sputtering in the presence of trace amounts of such a gas also decreases film coercivity.

In accordance with another embodiment of our invention, the coercivity of the film is controlled by varying the concentration of trace amounts of oxygen gas in the sputtering chamber.

BRIEF DESCRIPTION OF THE DRAWING

FIGS. 1a and 1b illustrate the effect of the concentration of nitrogen in a sputtering chamber on the coercivity of a film of $Co_{81}Ni_9Pt_{10}$.

FIG. 2 illustrates the effect of the concentration of nitrogen in a sputtering chamber on the coercivity of a film of $Co_{82}Ni_9Pt_9$.

FIG. 3 illustrates the effect of the concentration of nitrogen in a sputtering chamber on the coercivity of a film of $Co_{82.3}Ni_{9.2}Pt_{8.5}$.

FIG. 4 illustrates the effect of the concentration of oxygen in a sputtering chamber on the coercivity of a film of $Co_{81}Ni_9Pt_{10}$.

FIG. 5 illustrates the amount of nitrogen needed to achieved a coercivity of 650 Oe as a function of the concentration of water vapor in the sputtering chamber.

FIGS. 6a and 6b are hysteresis loops of a $Co_{81}Ni_9Pt_{10}$ film sputtered in the presence and absence of nitrogen, respectively.

FIG. 7 illustrates the effect of the concentration of nitrogen in a sputtering chamber on the saturation magnetization of a film of $Co_{81}Ni_9Pt_{10}$.

The films of FIGS. 1a, 1b, and 4 were formed using one sputtering system while the films of FIGS. 2, 3 and 5 to 7 were formed using a different sputtering system.

DETAILED DESCRIPTION

A process in accordance with our invention provides a thin film magnetic medium comprising an intrinsically high coercivity alloy such as a cobalt and platinum base alloy, e.g., Co-Pt, Co-Pt-Ni, Co-Pt-Cr, or Co-Pt-Pd. Advantageously, the coercivity of the film can be varied easily without reducing the saturation magnetization of the film, and without the need for providing a chromium underlayer.

In one embodiment, the film is sputtered onto a substrate using RF or DC magnetron sputtering apparatus. The sputtering takes place in an atmosphere including argon and nitrogen. The gas pressure in the sputtering chamber typically is between 5 to 70 millitorr, while the partial pressure of nitrogen in the chamber is between $10^{-4}$ and $10^{-7}$ torr. Of importance, the concentration of nitrogen in the sputtering chamber affects the coercivity of the resulting film as illustrated in the graphs of FIGS. 1a, 1b, 2, and 3. (The concentration of nitrogen in these figures is expressed as a percentage by volume of the gas present in the sputtering chamber.) The data graphed in FIGS. 1b, 2, and 3 was taken by RF sputtering an approximately 700Å thick film of a Co-Ni-Pt alloy onto a substrate of aluminum plated with NiP. The data graphed in FIG. 1a was taken by sputtering an approximately 1400Å thick film of CO-Ni-Pt alloy onto an NiP plated aluminum substrate. The film coercivity Hc decreases as film thickness increases. Thus, the coercivities graphed in FIG. 1a are lower than the coercivities graphed in FIG. 1b, in part because the films of FIG. 1a are thicker than the films of FIG. 1b. The coercivities are also different because the films of FIG. 1a were sputtered at a different pressure than the films of FIG. 1b. The effect of pressure on coercivity is discussed below.

The data in the graphs of FIGS. 1a and 1b was taken by sputtering a $Co_{81}Ni_9Pt_{10}$ alloy onto the substrate in an argon and nitrogen atmosphere at pressures of 10 and 20 millitorr, respectively. As can be seen in FIG. 1a, the coercivity of the resulting film decreases from about 650 Oe to 300 Oe as the concentration of nitrogen in the gas mixture increases from 0% to 0.5%. In FIG. 1b, the film coercivity decreases from about 850 Oe to 220 Oe as the nitrogen gas concentration increases from 0% to 0.5%. Thus, when forming a film, a selected amount of nitrogen is introduced into the sputtering chamber to reduce the film coercivity to a desired value. For example, if it is desired to obtain a coercivity of 650 Oe and the total gas pressure in the sputtering chamber is 20 millitorr, the gas in the sputtering chamber should include about 0.3% nitrogen and 99.7% argon.

Of importance, coercivity is related to total gas pressure in the sputtering chamber. Specifically, a lower gas pressure results in a lower coercivity. (This effect is described, for example, in "Corrosion-Resisting Co-Pt Thin Film Medium for High Density Recording", by Yanagisawa et al., published in IEEE Transactions on Magnetics in 1983, incorporated herein by reference.) Thus, the coercivities of the films of FIG. 1b, which are formed using a higher gas pressure than the pressure used to form the films of FIG. 1a, are higher than the coercivities of the films of FIG. 1a for a given nitrogen concentration for this reason as well. This effect is also illustrated in FIG. 3.

The data in the graph of FIG. 2 was obtained by sputtering a $Co_{82}Ni_9Pt_9$ alloy onto a substrate. The gas pressure in the sputtering chamber was 20 millitorr. As can be seen, the coercivity of the films in FIG. 2 decreases from about 1,120 Oe to 620 Oe as the nitrogen concentration increases from 0% to 0.8%.

FIG. 3 illustrates the effect of the nitrogen concentration on the coercivity of a $Co_{82.3}Ni_{9.2}Pt_{8.5}$ film. The two curves of FIG. 3 indicate that a film sputtered in a higher gas pressure (in this case, 40 millitorr) has a greater coercivity than a film sputtered in a lower gas pressure (30 millitorr). At 40 millitorr, the coercivity of the films of FIG. 3 decreases from 990 Oe to 680 Oe as the nitrogen concentration increases from 0% to 0.67%, while at 30 millitorr, the coercivity decreases from 940 Oe to 500 Oe as the nitrogen concentration increases from 0% to 0.67%.

The intrinsic coercivity of the sputtered film also depends on the percentage of platinum in the film. Specifically, a film with a higher concentration of platinum generally has a higher coercivity. Typical films used in accordance with our invention include more than 5% platinum by mole. (Although the films of FIG. 2 have a lower platinum content than the films of FIG. 1b, the coercivities graphed in FIG. 2 are greater than the coercivities graphed in FIG. 1b for a given nitrogen concentration. This is because of various differences in the sputtering apparatus used to form the films of FIG. 1b and FIG. 2.)

It will be appreciated by those skilled in the art in light of this specification that by varying the concentration of a selected gas in the sputtering chamber, in one embodiment nitrogen, the coercivity of the resulting film is varied without varying the saturation magnetization Ms, and without having to change the sputtering target. FIG. 7 illustrates the saturation magnetization Ms for $Co_{81}Ni_9Pt_{10}$ films sputtered in the presence of different nitrogen concentrations. The films of FIG. 7 are about 700Å thick and were sputtered in the presence of an argon-nitrogen atmosphere. As can be seen, saturation magnetization of the films is approximately 1200 emu/cc, and is not significantly reduced by the presence of nitrogen within the useful range of nitrogen concentrations (e.g., less than 1%).

As is known in the art, important figures of merit used to evaluate films are the hysterises loop squareness S and the coercivity squareness S* defined as follows:

$$S = Mr/Ms$$

$$S^* = 1 - \frac{Mr}{Hc} \cdot 1/\frac{dM}{dH}\bigg|_{H=Hc}$$

Ideally $S=S^*=1$. A film having high coercivity squareness S* provides a good signal to noise ratio and good resolution, and a film having a high hysteresis squareness S provides a strong output signal, hence a high signal to noise ratio. We have found that the hysteresis loop squareness S and the coercivity squareness S* are significantly improved by sputtering in the presence of nitrogen. FIGS. 6a and 6b illustrate hysteresis loops for $Co_{81}Ni_9Pt_{10}$ films sputtered in the presence and absence, respectively, of nitrogen. Without nitrogen, $S=0.67$ and $S^*=0.76$, while with nitrogen, $S=0.84$ and $S^*=0.89$. Thus, the film of FIG. 6a exhibits superior hysteresis squareness and coercivity squareness.

In another embodiment of our invention, during sputtering, oxygen is introduced into the sputtering chamber instead of nitrogen. We have found that oxygen also reduces coercivity of the resulting film. The oxygen is typically provided by introducing water vapor having a partial pressure of less than $10^{-4}$ torr into the sputtering chamber. FIG. 4 illustrates the effect of oxygen on the coercivity of a 700Å thick film of $Co_{81}Ni_9Pt_{10}$. The coercivity of the films of FIG. 4 decreases from 950 Oe to 280 Oe as the oxygen concentration increases from 0% to about 0.5%. Thus, if it is desired to form a film having a coercivity of 650 Oe, in one embodiment, a 700Å thick film of $Co_{81}Ni_9Pt_{10}$ is sputtered onto a substrate at 20 millitorr of pressure in an atmosphere of 0.33% oxygen and 99.67% argon.

It should be noted that although the film coercivity can be controlled by sputtering in the presence of oxygen, oxygen does not improve the hysteresis squareness as much as nitrogen does.

In an alternative embodiment, oxygen and nitrogen are both present in the sputtering chamber during sputtering. The oxygen in this embodiment is typically provided by decomposition of water vapor. Curves 1 and 2 of FIG. 5 illustrate the amount of nitrogen needed in the sputtering chamber to produce a film exhibiting a coercivity of 650 Oe as a function of the concentration of water vapor and hydrogen, respectively, detected in the sputtering chamber after sputtering. (The hydrogen detected in the sputtering chamber came from the portion of the water vapor which decomposed into hydrogen and oxygen during sputtering.) The data graphed in FIG. 5 was taken by sputtering a 700Å thick $Co_{81}Ni_9Pt_{10}$ film in an argon-nitrogen-water vapor atmosphere at 20 millitorr. In the films of FIG. 5, for hydrogen concentrations between 0.5% and 0.95% and water vapor concentrations between 0.2% and 0.28%, a coercivity of 650 Oe can be achieved with a nitrogen concentration between 0.66% and 0.87%. Since oxygen and nitrogen both reduce the coercivity of the resulting film, the more oxygen is present in the sputtering chamber, the less nitrogen is required to form a film having a given coercivity, and vice versa. Thus, where the concentration of hydrogen and water vapor is high, a small concentration of nitrogen (0.55%) is required to achieve a coercivity of 650 Oe, whereas if the concentration of hydrogen and water vapor is low, a larger concentration of nitrogen (0.87%) is required. We have found, however, that if the water vapor concentration in the sputtering chamber exceeds 1%, the coercivity of the resulting film cannot be controlled by varying the nitrogen concentration.

While the invention has been described with respect to specific embodiments, those skilled in the art will recognize that changes can be made to form and detail without departing from the spirit and scope of the invention. For example, instead of using an NiP plated aluminum substrate, other substrates can be used, including NiP substrates coated with a nonferromagnetic film such as chromium or other metals or insulators. Substrates comprising glass, silicon, polymers, or ceramic materials are also appropriate. In addition, an inert gas other than argon can be present in the sputtering chamber. Also, the present process can be used to form films having a range of coercivities, e.g. from 600 Oe to 2000 Oe. In addition, in some embodiments, instead of forming a cobalt-platinum based alloy on a substrate, another intrinsically high coercivity cobalt or iron based alloy is sputtered onto a substrate in the presence of nitrogen gas. Accordingly, all such modifications come within the present invention.

We claim:

1. A method for manufacturing a film of recording media comprising the steps of:
   sputtering an alloy film onto a substrate, said alloy comprising platinum and cobalt;
   controlling the coercivity of the film by introducing nitrogen into the sputtering chamber, the concentration of said nitrogen in said sputtering chamber being less than 1%, the coercivity of the resulting film decreasing as the amount of nitrogen introduced into said sputtering chamber increases, the coercivity of the resulting film being greater than about 600 Oe; and
   limiting the amount of oxygen in said sputtering chamber so that the concentration of oxygen in said sputtering chamber is insufficient to significantly affect the coercivity of said film.

2. The method of claim 1 further comprising the step of introducing oxygen into the sputtering chamber, the oxygen also varying the coercivity of the resulting film.

3. The method of claim 1 wherein said nitrogen has a partial pressure between $10^{-4}$ and $10^{-7}$ torr.

4. The method of claim 1 wherein said step of introducing nitrogen comprises the step of introducing a gaseous compound comprising nitrogen, said gaseous compound decomposing during sputtering.

5. A method for manufacturing a film of magnetic recording media comprising the steps of:
   sputtering an alloy film onto a substrate, said alloy comprising platinum and cobalt; and
   controlling the coercivity of said alloy by introducing oxygen into the sputtering chamber, the concentration of oxygen in said sputtering chamber being less than about 1%, the coercivity of the resulting film varying in response to the amount of oxygen introduced into said sputtering chamber, the coercivity of the resulting film being reduced as the amount of oxygen in said sputtering chamber increases, the coercivity of the resulting film being greater than about 600 Oe.

6. The method of claim 5 wherein said oxygen is introduced into the sputtering chamber in the form of water vapor.

7. The method of claim 6 wherein said water vapor has a partial pressure less than $10^{-4}$ torr.

8. The method of claim 5 wherein said step of introducing oxygen comprises the step of introducing a gaseous compound comprising oxygen, said gaseous compound decomposing during sputtering.

9. A method for manufacturing a film of recording media comprising the steps of:
sputtering an alloy film onto a substrate, said alloy film having an intrinsic coercivity greater than about 600 Oe;
controlling the coercivity of said film by introducing a selected gas into the sputtering chamber, the coercivity of said film decreasing as the amount of said selected gas introduced in said sputtering chamber increases, wherein said selected gas comprises oxygen or nitrogen and has a concentration less than 1%; and limiting the amount of oxygen in said sputtering chamber so that the presence of oxygen in said sputtering chamber does not cause said film to exhibit a coercivity less than about 600 Oe.

10. The method of claim 9 wherein said alloy is iron-based or cobalt-based.

11. The method of claim 9 wherein the partial pressure of said selected gas is less than $10^{-4}$ torr.

12. The method of claim 1 or 5 wherein said alloy includes another metal, said alloy having an intrinsic coercivity greater than about 650 Oe.

13. The method of claim 1 or 5 wherein the gas in said sputtering chamber comprises mostly argon.

14. The method of claim 1 or 5 wherein said alloy is at least 5% platinum.

15. The method of claim 1 or 5 wherein said alloy is sputtered onto a layer of nonferromagnetic metal.

16. The method of claim 1 or 5 wherein said alloy is sputtered onto a layer of electrically insulating material.

17. The method of claim 1 or 9 wherein said step of limiting the amount of oxygen is accomplished by limiting the concentration of water vapor in said atmosphere.

* * * * *

UNITED STATES PATENT AND TRADEMARK OFFICE
CERTIFICATE OF CORRECTION

PATENT NO. : 4,749,459
DATED : June 7, 1988
INVENTOR(S) : Tsutomu T. Yamashita, et al.

It is certified that error appears in the above-identified patent and that said Letters Patent is hereby corrected as shown below:

Col. 1, line 31, "Mr. Mr. T" should read --Mr. Mr·T--.

Col. 2, line 47, "without altering" should read --without significantly altering--.

Col. 2, lines 49-50, "to vary saturation" should read --to significantly vary saturation--.

Col. 5, line 7, "hysterises" should read --hysteresis--.

Signed and Sealed this

Twenty-fourth Day of April, 1990

*Attest:*

HARRY F. MANBECK, JR.

*Attesting Officer*   *Commissioner of Patents and Trademarks*